US012672232B2

(12) United States Patent
Chen et al.

(10) Patent No.: US 12,672,232 B2
(45) Date of Patent: Jun. 30, 2026

(54) PRINTED CIRCUIT BOARD AND METHOD FOR MAKING THE SAME

(71) Applicant: Tong Hsing Electronic Industries, Ltd., Taipei City (TW)

(72) Inventors: Cheng-Yu Chen, Hsinchu County (TW); Shih-Han Wu, Hsinchu County (TW); Jhih-Wei Lai, Hsinchu County (TW); Jian-Yu Shih, Hsinchu County (TW); Ming-Yen Pan, Hsinchu County (TW)

(73) Assignee: TONG HSING ELECTRONIC INDUSTRIES, LTD., Taipei City (TW)

( * ) Notice: Subject to any disclaimer, the term of this patent is extended or adjusted under 35 U.S.C. 154(b) by 693 days.

(21) Appl. No.: 18/201,677

(22) Filed: May 24, 2023

(65) Prior Publication Data

US 2024/0284592 A1    Aug. 22, 2024

(30) Foreign Application Priority Data

Feb. 22, 2023    (TW) .................................. 112106432

(51) Int. Cl.
*H05K 1/09*        (2006.01)
*H05K 3/24*        (2006.01)
(52) U.S. Cl.
CPC .............. *H05K 1/09* (2013.01); *H05K 3/241* (2013.01); *H05K 2201/0183* (2013.01); *H05K 2201/095* (2013.01); *H05K 2201/10416* (2013.01)
(58) Field of Classification Search
CPC .. H05K 1/09; H05K 3/241; H05K 2201/0183; H05K 2201/095; H05K 2201/10416; H05K 1/111; H05K 1/11; H05K 1/02; H05K 3/4007; H05K 1/113; H05K 1/115; H05K 1/0256; H05K 2201/10242
USPC ......................... 174/255, 261, 250, 260, 262
See application file for complete search history.

(56) References Cited

U.S. PATENT DOCUMENTS

| | | | | |
|---|---|---|---|---|
| 6,426,011 B1 * | 7/2002 | Katoh | .................. | H05K 3/0094 |
| | | | | 427/98.1 |
| 6,593,534 B2 * | 7/2003 | Jones | ..................... | H05K 3/462 |
| | | | | 174/262 |
| 8,365,402 B2 * | 2/2013 | Furutani | ................ | H05K 1/113 |
| | | | | 29/829 |
| 9,807,867 B2 * | 10/2017 | Wu | ...................... | H05K 1/0216 |

(Continued)

FOREIGN PATENT DOCUMENTS

| | | |
|---|---|---|
| TW | I670998 | 9/2019 |

*Primary Examiner* — Angel R Estrada
(74) *Attorney, Agent, or Firm* — Li & Cai Intellectual Property Office

(57) ABSTRACT

A printed circuit board (PCB) is disclosed. The PCB includes a substrate having a plurality of through holes, a plurality of thermally-conductive blocks disposed in the through holes respectively, bonding structures respectively disposed in each through holes, and a metal circuit formed on the substrate. Particularly, the thermally-conductive block is tightly attached to the inner wall of the through hole through the bonding structure. In brief, the bonding structure includes a metal block and metal layers coated on both surfaces of the metal block to replace the conventional adhesive layer made of epoxy resin to tightly fix the thermally-conductive block in the through hole.

18 Claims, 10 Drawing Sheets

(56)          References Cited

U.S. PATENT DOCUMENTS

| | | | |
|---|---|---|---|
| 10,524,349 B2 * | 12/2019 | Yu ........................ | H05K 1/0204 |
| 11,769,719 B2 * | 9/2023 | Rosch .................... | H05K 1/111 |
| | | | 174/262 |
| 12,057,381 B2 * | 8/2024 | Lu .......................... | H05K 1/115 |
| 12,426,167 B2 * | 9/2025 | Kim ....................... | H05K 1/115 |

* cited by examiner

1

1

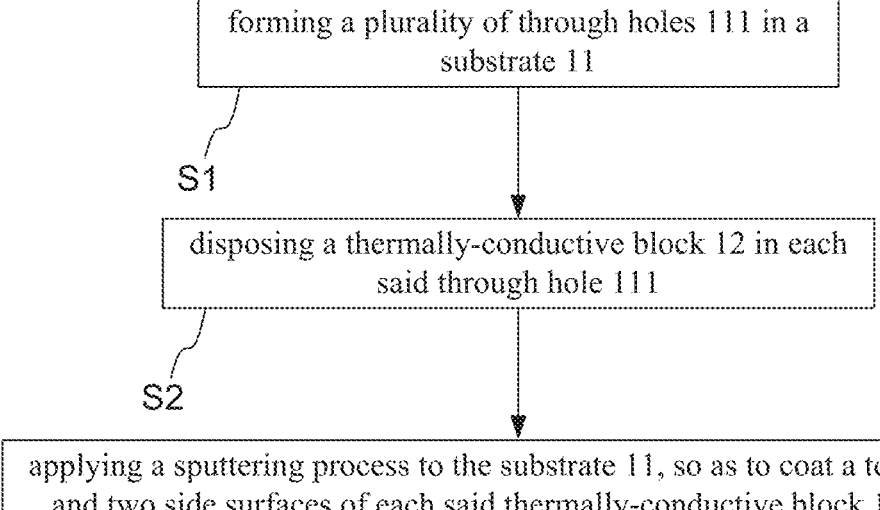

forming a plurality of through holes 111 in a
substrate 11

S1 disposing a thermally-conductive block 12 in each
said through hole 111

S2 applying a sputtering process to the substrate 11, so as to coat a top surface
and two side surfaces of each said thermally-conductive block 12, a top
surface of the substrate 11, and at least one inner wall of each said through
hole 111 with a sputtered metal layer 101

S3 applying an electroplating process to the substrate 11, such that each said
through hole 111 is filled with an electroplated metal member 102, and the
top surface of the substrate 11 is further coated with a first electroplated
metal layer 1L

S4 applying a thickness reducing process to the first
electroplated metal layer 1L

S5 patterning the first electroplated metal layer 1L to form a first upper metal
circuit layer 1L1 through a photolithography process, such that a bonding
structure 14 is formed in each said through hole 111 after the
photolithography process, and said thermally-conductive block 12 is tightly
attached to the inner wall of the through hole 111 through said adhesively
bonding structure 14

PRINTED CIRCUIT BOARD AND METHOD FOR MAKING THE SAME

BACKGROUND OF THE INVENTION

1. Field of the Invention

The present invention relates to the technology field of printed circuit board (PCB), and more particularly to a PCB having built-in thermally-conductive ceramic block and a manufacturing method thereof.

2. Description of the Prior Art

It is well known that printed circuit board (PCB) is used as a carrier board for supporting at least one electronic component, at least one electronic chip, and/or at least one modular electronic device. Nowadays, printed circuit boards are principally classified into three different types: single-layer board, double-layer board and multi-layer board. Among these circuit boards, the single-layer board is composed of a substrate and a conductive copper layer formed on a first surface of the substrate, such that at least one electronic component, at least one electronic chip, or at least one modular electronic device is allowed to be disposed on a second surface of the substrate. On the other hand, the double-layer board is composed of a substrate and a first conductive copper layer formed on a first surface of the substrate, a second conductive copper layer formed on a second surface of the substrate, and a plurality of vias penetrating the substrate. Therefore, at least one electronic component, at least one electronic chip, or at least one modular electronic device is allowed to be disposed on the first surface and/or the second surface of the substrate.

FIG. 1 illustrates a side cross-sectional view of a printed circuit board disclosed by Taiwan Patent No. 1670998. As FIG. 1 shows, the printed circuit board 1a comprises: a substrate 11a, a thermally-conductive ceramic block 12a built in the substrate 11a, and a circuit layer 13a formed on a top surface of the substrate 11a, wherein at least one electronic chip 21a and a plurality of electronic components 22a are mounted on the top surface of the circuit layer 13a.

Furthermore, FIG. 2A and FIG. 2B are provided for schematically describing a manufacturing process of the printed circuit board 11a that is shown in FIG. 1. The manufacturing process includes a plurality of steps as follows:

(1) forming at least one through holes 111a in a substrate 11a as FIG. 2A shows;

(2) disposing a thermally-conductive ceramic block 12a in each said through hole 111a;

(3) filling a bonding agent such as an epoxy resin into the gap between the thermally-conductive ceramic block 12a and the through hole 222a, and then solidifying the bonding agent to form an adhesive layer 10a;

(4) applying a desmear process to the substrate 11a, thereby removing the residual resin on the substrate 11a;

(5) depositing a metallic seed layer on the substrate 11a, and then thickening the metallic seed layer to form an electroplated copper layer 14a through electroplating; and (6) patterning the electroplated copper layer 14a to form a circuit layer 13a through photolithography.

According to industrial experiences, the epoxy resin has a heat transfer coefficient of 0.2-2.2 W/m·K, and the heat transfer coefficient of the electroplated copper layer is 300-

350 W/m·K. Accordingly, using the epoxy resin as said adhesive layer 10a causes a negative effect to the whole thermal conduction performance of the printed circuit board 1a. On the other hand, if the epoxy resin is used to fill into the gap between the thermally-conductive ceramic block 12a and the through hole 222a, a solidification process is needed to be applied to the epoxy resins to solidify the epoxy resin to form said adhesive layer 10a. Afterwards, a desmear process is also needed to be applied to the substrate 11a for removing the residual resin on the substrate 11a. As a result, the manufacturing process for making the printed circuit board 1a inevitably includes complex processing steps. Moreover, the most important point is that the adhesive layer 10a made of epoxy resin will certainly undergo aging process and becomes brittle with the increase of the usage time of the printed circuit board 1a. In other words, using the epoxy resin as said adhesive layer 10a causes a negative effect to the reliability of the printed circuit board 1a.

According to above descriptions, it is understood that there are still rooms for improvement in the conventional PCB having built-in thermally-conductive ceramic block. In view of this fact, inventors of the present application have made great efforts to make inventive research and eventually provided a printed circuit board and method for making the same.

SUMMARY OF THE INVENTION

The primary objective of the present invention is to disclose a printed circuit board, comprising: a substrate having a plurality of through holes, a plurality of thermally-conductive blocks disposed in the through holes respectively, and a metal circuit formed on the substrate. According to the present invention, each said through hole is provided with a bonding structure therein, such that the thermally-conductive block is tightly attached to the inner wall of the through hole through the bonding structure. Moreover, the bonding structure comprises a metal block and a metal layer coated on the two side surfaces of the metal block, respectively.

In brief, the bonding structure is used in place of the conventional adhesive layer made of epoxy resin to tightly fix the thermally-conductive block in the through hole. As such, the printed circuit board of the present invention has many advantages, including: enhanced thermal conduction ability, enhanced bonding strength of the thermally-conductive block with the inner wall of the through hole, elimination of the process of an adhesive agent solidifying step and a desmearing step, and avoiding the problem that the epoxy-based bonding structure would be aged and brittle by using a metal block and metal layers coated on the metal block.

To achieve the primary objective mentioned above, the present invention provides an embodiment of the printed circuit board, which comprises:

a substrate having a plurality of through holes;

a plurality of thermally-conductive blocks, disposed in the plurality of through holes respectively; and a first metal circuit layer, formed on a surface of the substrate;

wherein each said thermally-conductive block is attached to at least one inner wall of said through hole through a bonding structure that comprises a metal block and a metal layer coated on two side surfaces of the metal block, respectively.

In one embodiment, the metal block comprises an electroplated copper block, and the metal layer is selected from a group consisting of a sputtered copper layer and a sputtered Ti/Cu layer.

In one embodiment, the thermally-conductive block is selected from a group consisting of an aluminum nitride (AlN) block, an aluminum oxide ($Al_2O_3$) block, a silicon carbide (SiC) block, and a tungsten carbide (WC) block.

In a practicable embodiment, the printed circuit board of claim further comprises: a patterned dielectric layer, formed on the first metal circuit layer; and a second metal circuit layer, formed on the patterned dielectric layer, and electrically connected to the first metal circuit layer.

In one embodiment, the first metal circuit layer and the second metal circuit layer both comprise a copper circuit layer.

Moreover, the present invention provides another embodiment of the printed circuit board, which comprises:

a substrate having a plurality of through holes;

a plurality of thermally-conductive blocks, disposed in the plurality of through holes respectively;

a first upper metal circuit layer, formed on a top surface of the substrate; and a first lower metal circuit layer, formed on a bottom surface of the substrate;

wherein each said thermally-conductive block is attached to at least one inner wall of said through hole through a bonding structure that comprises a metal block and a metal layer coated on two side surfaces of the metal block, respectively.

In one embodiment, the metal block comprises an electroplated copper block, and the metal layer is selected from a group consisting of a sputtered copper layer and a sputtered Ti/Cu layer.

In one embodiment, the thermally-conductive block is selected from a group consisting of an AlN block, an $Al_2O_3$ block, a SiC block, and a WC block.

In a practicable embodiment, the printed circuit board further comprises:

a first patterned dielectric layer, formed on the first upper metal circuit layer; and a second upper metal circuit layer, formed on the first patterned dielectric layer, and electrically connected to the first upper metal circuit layer.

In another one practicable embodiment, the printed circuit board further comprises:

a second patterned dielectric layer, formed on the first lower metal circuit layer; and a second lower metal circuit layer, formed on the second patterned dielectric layer, and electrically connected to the first lower metal circuit layer.

In one embodiment, all of the first upper metal circuit layer, the second upper metal circuit layer, the first lower metal circuit layer, and the second lower metal circuit layer comprise a copper circuit layer.

The present invention also provides an embodiment of a method for making a printed circuit board, which comprises the following steps:

forming a plurality of through holes in a substrate;

respectively disposing a thermally-conductive block in each said through hole;

applying a sputtering process to the substrate, so as to coat a top surface and two side surfaces of said thermally-conductive block, a top surface of the substrate, and at least one inner wall of each said through hole with a sputtered metal layer, respectively;

applying an electroplating process to the substrate, such that each said through hole is filled with an electroplated metal member, and the top surface of the substrate is further coated with a first electroplated metal layer;

applying a thickness reducing process to the first electroplated metal layer; and patterning the first electroplated metal layer to form a first upper metal circuit layer through a photolithography process, such that a bonding structure is formed in each said through hole after the photolithography process; wherein the bonding structure comprises the electroplated metal member and the sputtered metal layer coated on the inner wall of the through hole, and said thermally-conductive block is tightly attached to the inner wall of the through hole through said bonding structure.

In one embodiment, the thermally-conductive block is selected from a group consisting of an AlN block, an $Al_2O_3$ block, a SiC block, and a WC block.

In one embodiment, the electroplated metal member comprises an electroplated copper block, and the sputtered metal layer is selected from a group consisting of a sputtered copper layer and a sputtered Ti/Cu layer.

In a practicable embodiment, the method further comprises the following steps:

forming a first patterned dielectric layer on the first upper metal circuit layer; and forming a second upper metal circuit layer on the first patterned dielectric layer, so as to allow the second upper metal circuit layer to be electrically connected to the first upper metal circuit layer.

In another one practicable embodiment, the method further comprises the following steps:

forming a metallic seed layer on a bottom surface of the substrate;

applying an electroplating process to the substrate, thereby forming a second electroplated metal layer on the bottom surface of the substrate;

applying a thickness reducing process to the second electroplated metal layer; and patterning the second electroplated metal layer to form a second upper metal circuit layer through a photolithography process.

In another one practicable embodiment, the method further comprises the following steps:

forming a second patterned dielectric layer on the first lower metal circuit layer; and forming a second lower metal circuit layer on the second patterned dielectric layer, so as to allow the second lower metal circuit layer to be electrically connected to the first lower metal circuit layer.

In one embodiment, all of the first upper metal circuit layer, the second upper metal circuit layer, the first lower metal circuit layer, and the second lower metal circuit layer comprise a copper circuit layer.

BRIEF DESCRIPTION OF THE DRAWINGS

The invention as well as a preferred mode of use and advantages thereof will be best understood by referring to the following detailed description of an illustrative embodiment in conjunction with the accompanying drawings, wherein:

FIG. 7 shows a flowchart diagram of a method for making a printed circuit board according to the present invention;

DETAILED DESCRIPTION OF THE PREFERRED EMBODIMENTS

To more clearly describe a printed circuit board and a manufacturing method thereof according to the present invention, embodiments of the present invention will be described in detail with reference to the attached drawings hereinafter.

The present invention discloses a printed circuit board, which comprises: a substrate having a plurality of through holes, a plurality of thermally-conductive blocks disposed in the through holes respectively, and a metal circuit formed on the substrate. According to the present invention, each said through hole is provided with a bonding structure therein, such that the thermally-conductive block is tightly attached to the inner wall of the through hole through the bonding structure. Moreover, the bonding structure comprises a metal block and a metal layer coated on two side surfaces of the metal block, respectively. In brief, the bonding structure is used to replace the conventional adhesive layer made of epoxy resin to tightly fix the thermally-conductive block in the through hole. As such, the printed circuit board of the present invention has many advantages, including: enhanced thermal conduction ability, enhanced bonding strength of the thermally-conductive block with the inner wall of the through hole, elimination the process of an adhesive agent solidifying step and a desmearing step, and avoiding the problem that the epoxy-based bonding structure would be aged and brittle by using a metal block and a metal layer coated on the metal block.

First Embodiment

Figure 3:
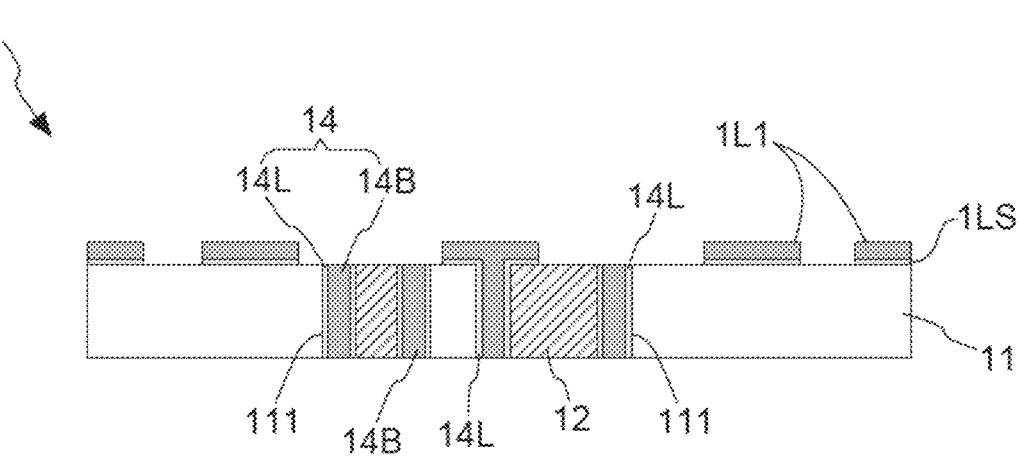
FIG. 3 shows a cross-sectional view of a first embodiment of a printed circuit board according to the present invention.

With reference to FIG. 3, there is shown a cross-sectional view of a first embodiment of a printed circuit board according to the present invention. As FIG. 3 shows, the first embodiment of the printed circuit board 1 comprises: a substrate 11 having a plurality of through holes 11, a plurality of thermally-conductive blocks 12 disposed in the plurality of through holes 11 respectively, and a first metal circuit layer 1L 1 formed on a surface of the substrate 11. Moreover, according to the particular design of the present invention, each of said thermally-conductive block 12 is attached to the inner wall(s) of said through hole 111 through a bonding structure 14, in which the bonding structure 14 comprises a metal block 14B and a metal layer 14L coated on two side surfaces of the metal block 14B, respectively. In a practical application, the metal block 14B can be, but is not limited to, an electroplated copper block. Moreover, the metal layer 14L can be, but is not limited to, a sputtered copper layer or a sputtered Ti/Cu layer. On the other hand, the thermally-conductive block 12 can be, but is not limited to, an AlN block, an $Al_2O_3$ block, a SiC block, or a WC block.

Furthermore, a metallic seed layer may be deposited on the surface of the substrate 11, and then a thickening process is carried out to thicken the metallic seed layer to form an electroplated copper layer. Afterwards, the metallic seed layer the electroplated metal layer can be further patterned to form said first metal circuit layer 1L1 as shown in FIG. 3 through a photolithography process using a dry film. Therefore, in FIG. 3, there is a patterned metallic seed layer 1LS existing between the first metal circuit layer 1L1 and the surface of the substrate 11.

Second Embodiment

Figure 4:
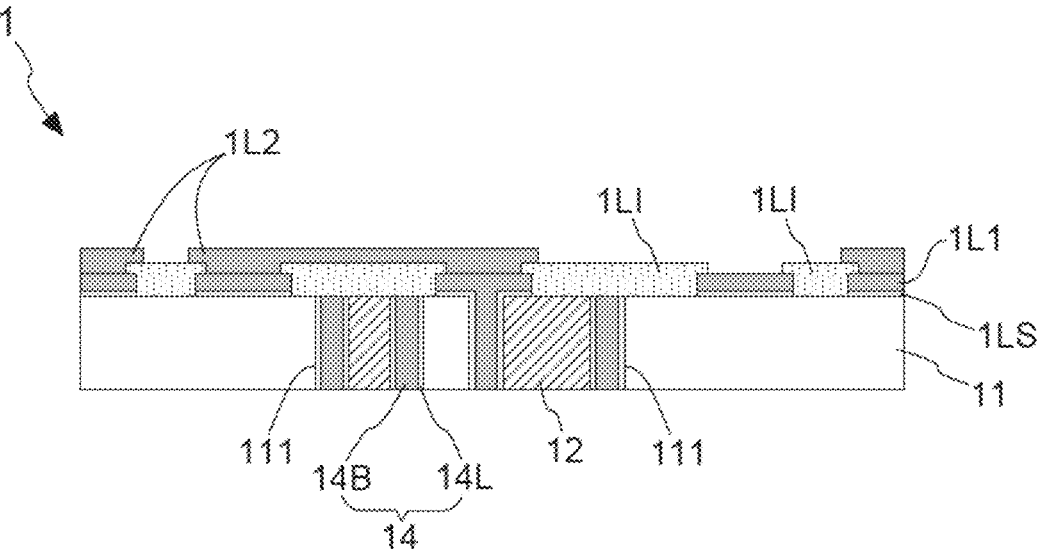
FIG. 4 shows a cross-sectional view of a second embodiment of the printed circuit board according to the present invention.

With reference to FIG. 4, there is shown a cross-sectional view of a second embodiment of the printed circuit board according to the present invention. As FIG. 4 shows, the second embodiment of the printed circuit board 1 also comprises: a substrate 11 having a plurality of through holes 11, a plurality of thermally conductive blocks 12 disposed in the plurality of through holes 11 respectively, a plurality of bonding structures 14, and a first metal circuit layer 1L1 formed on a surface of the substrate 11. Particularly, in the second embodiment, the printed circuit board 1 further comprises a patterned dielectric layer 1L1 formed on the first metal circuit layer 1L1, and a second metal circuit layer 1L2 formed on the patterned dielectric layer and electrically connected to the first metal circuit layer 1L1. In practical applications, the first metal circuit layer 1L1 and the second metal circuit layer 1L2 can both comprise, but are not limited to, a copper circuit layer.

Third Embodiment

Figure 5:
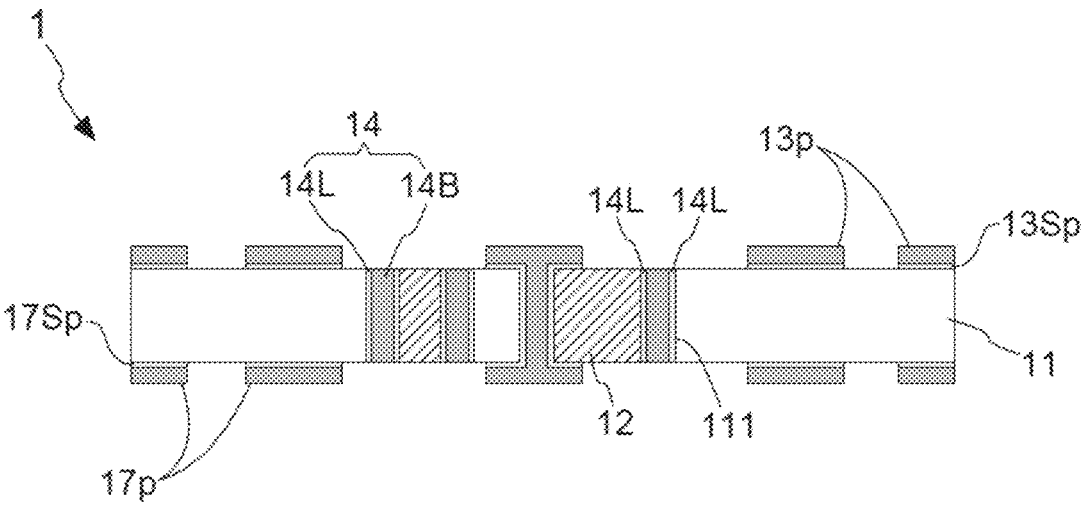
FIG. 5 shows a cross-sectional view of a third embodiment of the printed circuit board according to the present invention.

With reference to FIG. 5, there is shown a cross-sectional view of a third embodiment of the printed circuit board according to the present invention. As FIG. 5 shows, the third embodiment of the printed circuit board 1 comprises: a substrate 11 having a plurality of through holes 111, a plurality of thermally conductive blocks 12 disposed in the plurality of through holes 11 respectively, a plurality of bonding structures 14, a first upper metal circuit layer 13*p* formed on a top surface of the substrate 11, and a first lower metal circuit layer 17*p* formed on a bottom surface of the substrate 11. Moreover, according to the particular design of the present invention, each of said thermally-conductive block 12 is disposed in a through hole 11 and attached to the inner wall(s) of one said through hole 111 through a bonding structure 14, in which the bonding structure 14 comprises a metal block 14B and a metal layer 14L coated on two side surfaces of the metal block 14B, respectively. In a practical application, the metal block 14B can be, but is not limited to, an electroplated copper block. Moreover, the metal layer 14L can be, but is not limited to, a sputtered copper layer or a sputtered Ti/Cu layer. On the other hand, the thermally-conductive block 12 can be, but is not limited to, an AlN block, an Al$_2$O$_3$ block, a SiC block, or a WC block.

As described in more detail below, it is able to deposit a first metallic seed layer on the top surface of the substrate 11, and then thicken the first metallic seed layer to form a first electroplated copper layer. Afterwards, the first electroplated metal layer can be further patterned to form said first upper metal circuit layer 13p as shown in FIG. 5 through a photolithography process using a dry film. Therefore, in FIG. 5, there is a first patterned metallic seed layer 13Sp existing between the first upper metal circuit layer 13p and the top surface of the substrate 11. Likewise, it is able to deposit a second metallic seed layer on the bottom surface of the substrate 11, and then thicken the second metallic seed layer to form a second electroplated copper layer. Afterwards, the second electroplated metal layer can be further patterned to form said second upper metal circuit layer 17p as shown in FIG. 5 shows through a photolithography process using a dry film. Therefore, in FIG. 5, there is a second patterned metallic seed layer 17Sp existing between the second upper metal circuit layer 17p and the bottom surface of the substrate 11.

Fourth Embodiment

Figure 6:
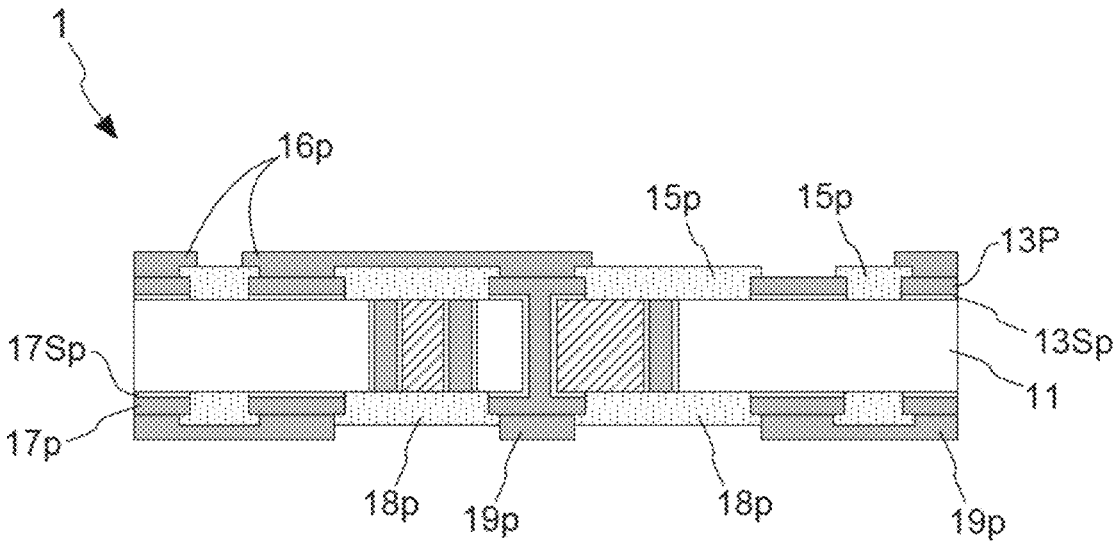
FIG. 6 shows a cross-sectional view of a four embodiment of the printed circuit board according to the present invention.

With reference to FIG. 6, there is shown a cross-sectional view of a fourth embodiment of the printed circuit board according to the present invention. As FIG. 6 shows, the fourth embodiment of the printed circuit board 1 also comprises: a substrate 11 having a plurality of through holes 11, a plurality of thermally-conductive blocks 12 disposed in the plurality of through holes 11 respectively, a plurality of bonding structures 14, a first upper metal circuit layer 13p formed on a top surface of the substrate 11, and a first lower metal circuit layer 17p formed on a bottom surface of the substrate 11. Particularly, in the fourth embodiment, the printed circuit board 1 further comprises a first patterned dielectric layer 15p, a second upper metal circuit layer 16p, a second patterned dielectric layer 18p, and a second lower metal circuit layer 19p. As described in more detail below, the first patterned dielectric layer 15p is formed on the first upper metal circuit layer 13p, and the second upper metal circuit layer 16p is formed on the first patterned dielectric layer 15p so as to allow the second upper metal circuit layer 16p to be electrically connected to the first upper metal circuit layer 13p. On the other hand, the second patterned dielectric layer 18p is formed on the first lower metal circuit layer 17p, and the second lower metal circuit layer 19p is formed on the second patterned dielectric layer 18p so as to allow the second lower metal circuit layer 19p to be electrically connected to the first lower metal circuit layer 17p. In practical applications, all of the first upper metal circuit layer 13p, the first lower metal circuit layer 17p, the second upper metal circuit layer 16p, and the second lower metal circuit layer 19p can be, but are not limited to, a copper circuit layer.

Manufacturing Method of the Printed Circuit Board

Figure 8A:
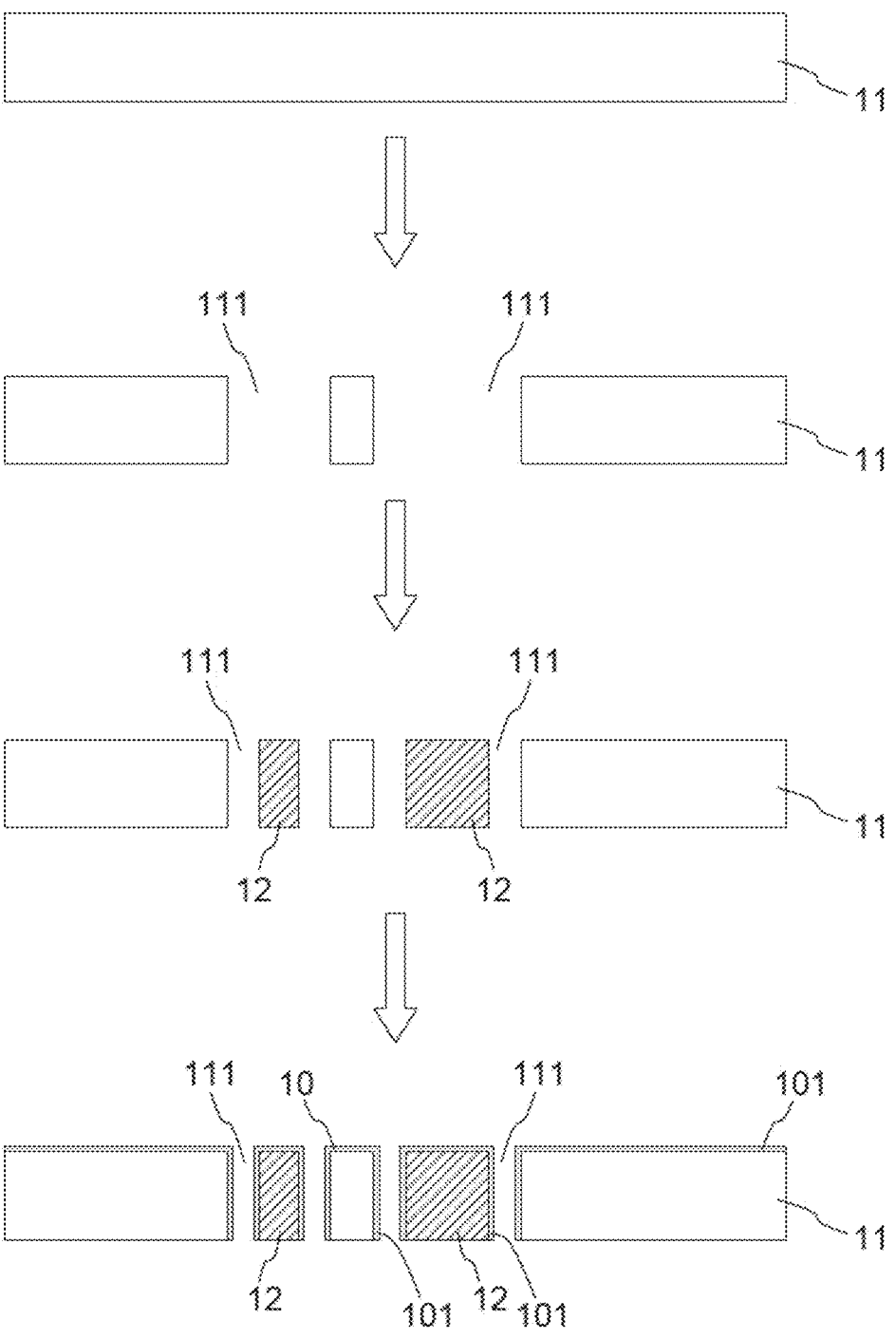
FIG. 8A and FIG. 8B show diagrams for schematically describing a manufacturing process of the printed circuit board shown in FIG. 3.
Figure 8B:
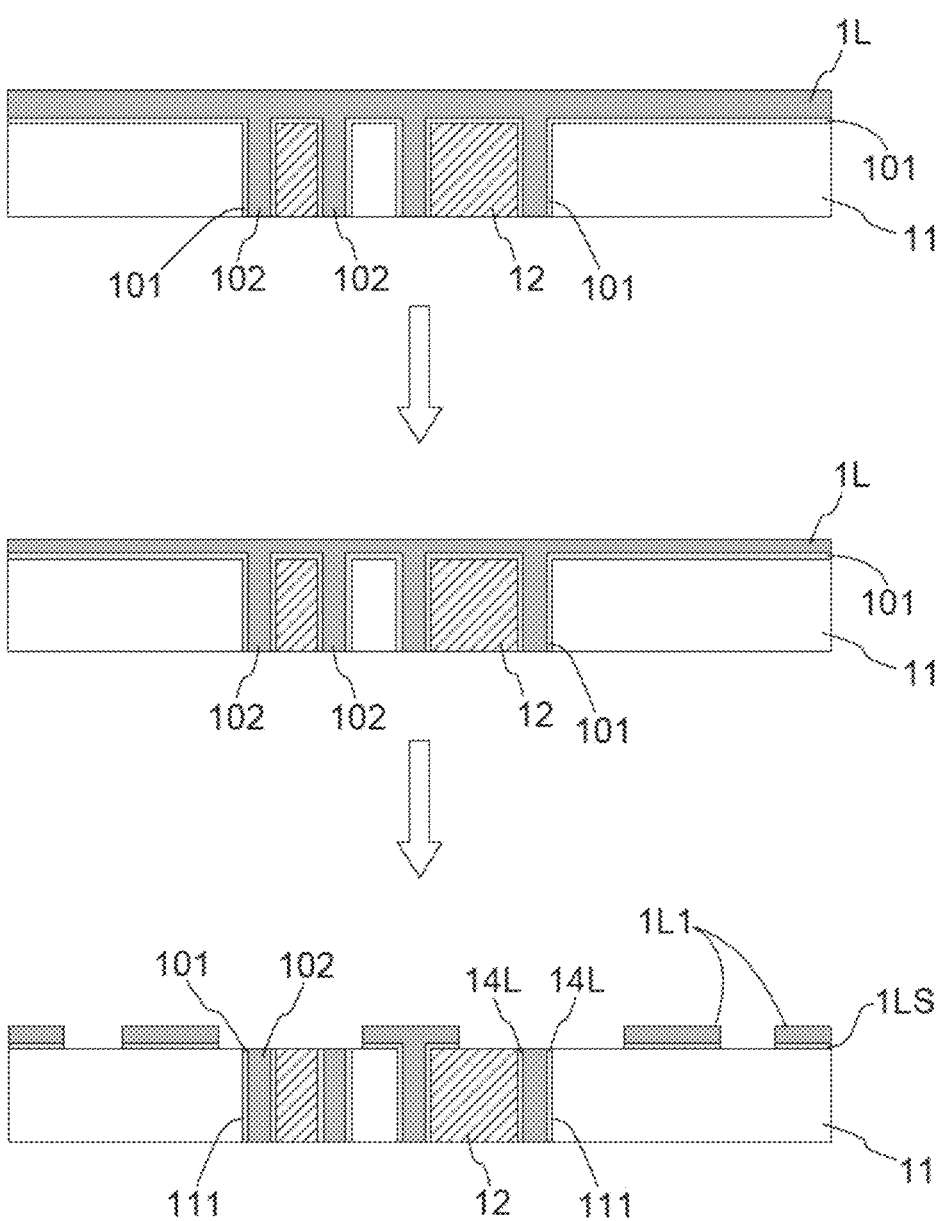

FIG. 7 illustrates a flowchart diagram of a method for making a printed circuit board according to the present invention. Moreover, FIG. 8A and FIG. 8B show diagrams for schematically describing a manufacturing process of the printed circuit board shown in FIG. 3. The manufacturing process of the printed circuit board 1 of FIG. 3 is started with, steps S1-S2 of FIG. 7 by forming a plurality of through holes 111 in a substrate 11 and then disposing a thermally conductive block 12 in each said through hole 111. In practical applications, the substrate 11 can be, but is not limited to, a solid substrate, a flexible substrate, or a combination thereof. In addition, the thermally-conductive block 12 can be, but is not limited to, an AlN block, an Al$_2$O$_3$ block, a SiC block, or a WC block.

Figure 1:
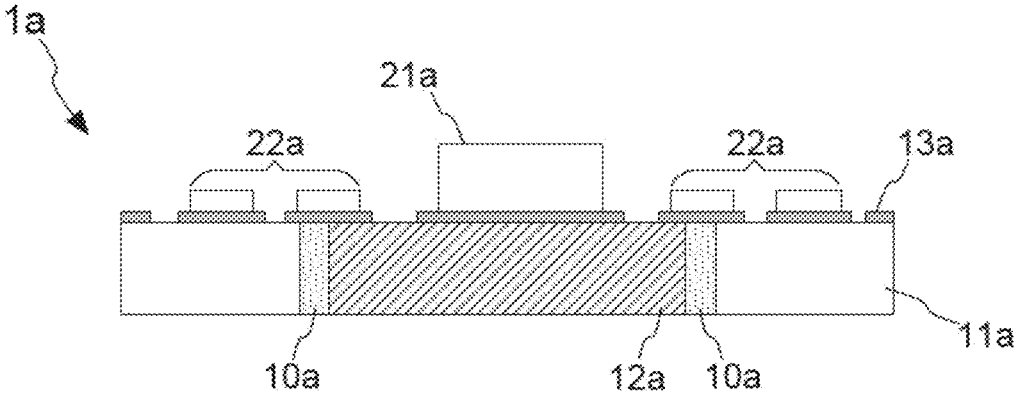
FIG. 1 shows a cross-sectional view of a printed circuit board disclosed by Taiwan Patent No. 1670998.
Figure 2A:
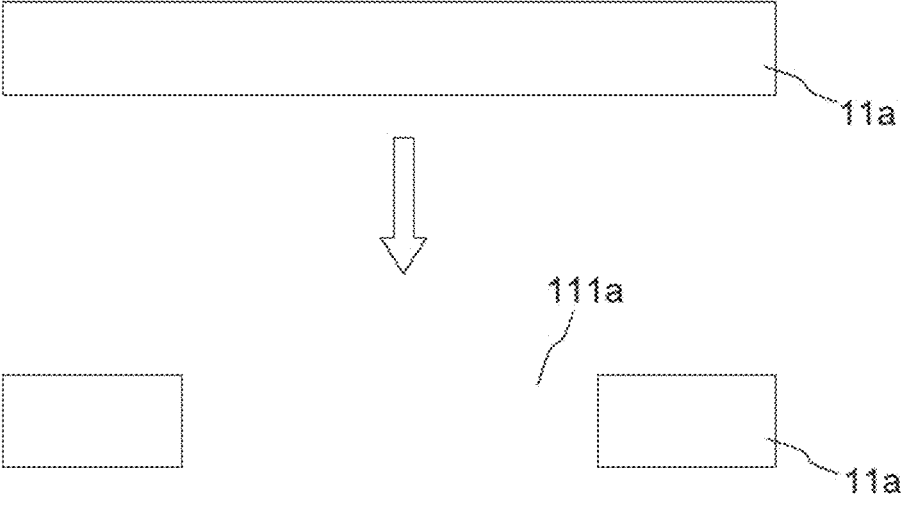
FIG. 2A and FIG. 2B show diagrams for schematically describing a manufacturing process of the printed circuit board shown in FIG. 1.
Figure 2B:
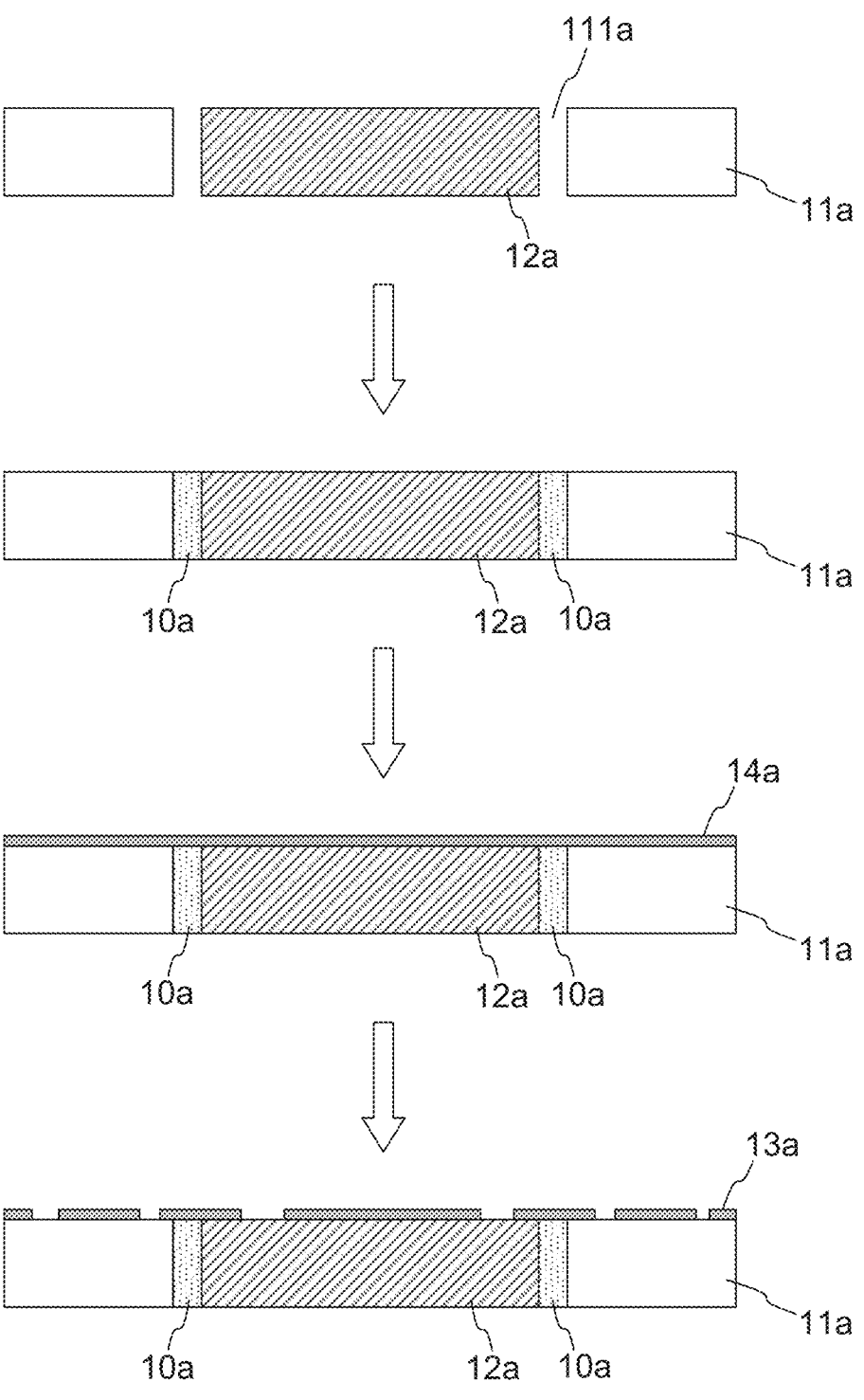

Subsequently, the process flow is proceeded to step S3, so as to apply a sputtering process to the substrate 11, thereby coating a top surface and two side surfaces of each said thermally-conductive block 12, a top surface of the substrate 11, and at least one inner wall of each said through hole 111 with a sputtered metal layer 10, respectively. In practical application, the sputtered metal layer 10 can be, but is not limited to, a sputtered copper layer or a sputtered Ti/Cu layer. Furthermore, as FIG. 7 and FIG. 8B show, the process flow is next proceeded to step S4, so as to apply an electroplating process to the substrate 11, such that each of said through hole 111 is filled with an electroplated metal member 102, and in the meantime the top surface of the substrate 11 is further coated with a first electroplated metal layer 1L, in which the first electroplated metal layer 1L comprises an electroplated copper layer. Subsequently, the process flow is next proceeded to step S5, so as to apply a thickness reducing process to the first electroplated metal layer 1L. Consequently, the process flow is next proceeded to step S6, so as to pattern the first electroplated metal layer 1L to form a first upper metal circuit layer 1L1 through a photolithography process, and in the meantime the sputtered metal layer 10 (that is, the metal seed layer) is etched to form a patterned metal seed layer 1LS. After the photolithography process is completed, the electroplated metal member 102 (that is, the metal block 14B of FIG. 1) and the sputtered metal layer 101 (that is, the metal layer 14L of FIG. 1) constitute a bonding structure 14, such that the thermall-conductive blocks 12 are bonded to the inner walls of the through holes 111 by the bonding structures 14.

Figure 9:
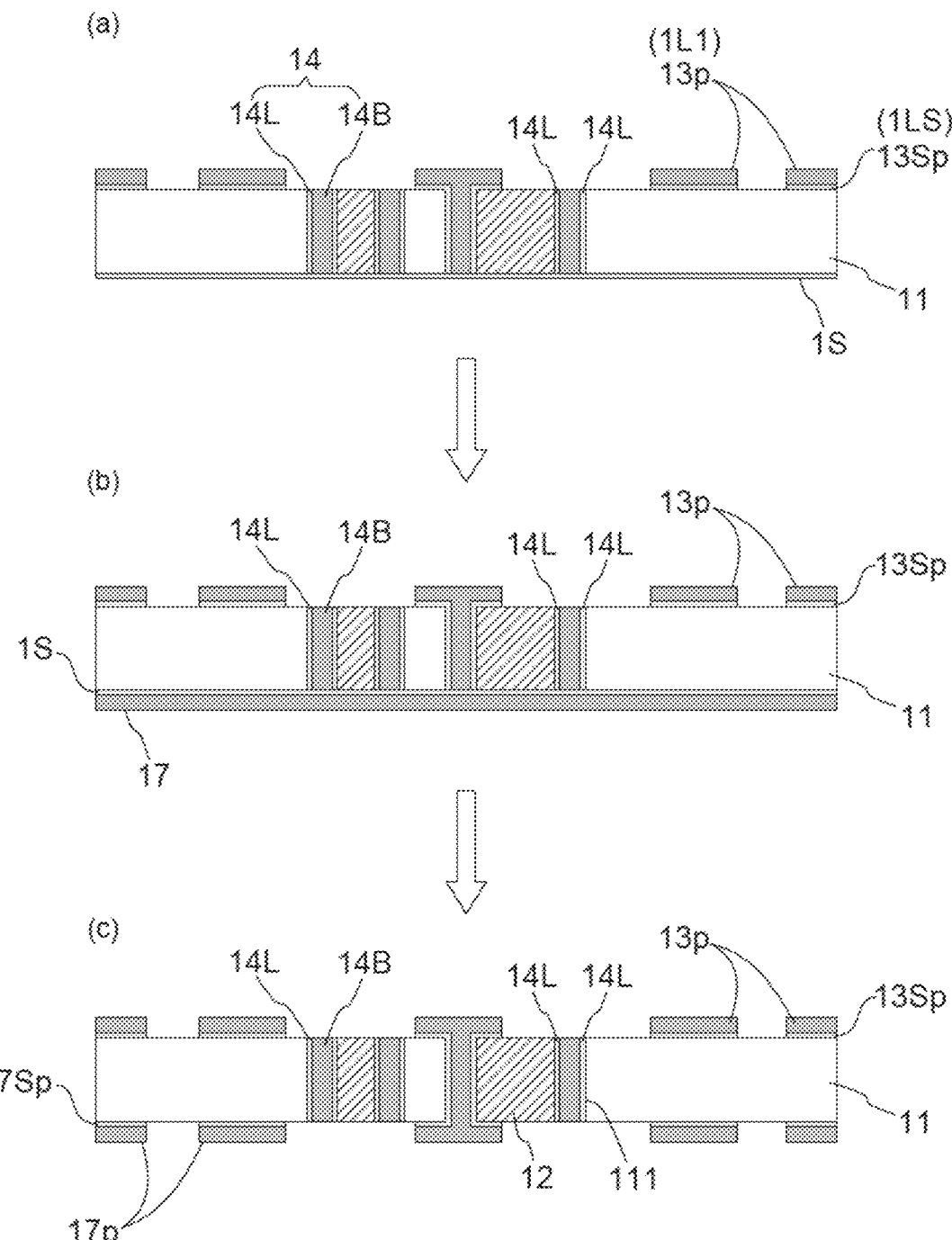
FIG. 9 show diagrams for schematically describing a manufacturing process of the printed circuit board shown in FIG. 5.

Furthermore, FIG. 9 show diagrams for schematically describing a manufacturing process of the printed circuit board shown in FIG. 5. In FIG. 9, diagram (a) depicts the printed circuit board as shown in FIG. 3. Moreover, for the purpose of clarification, said first metal circuit layer 1L1 and said patterned metallic seed layer 1LS in FIG. 3 are correspondingly renamed as first upper metal circuit layer 13p and first patterned metallic seed layer 13Sp in FIG. 9. Therefore, diagrams (a)-(c) of FIG. 9 illustrate that a first lower metal circuit layer 17p is formed on the bottom surface of the substrate 11 by the following processing steps:

forming a metallic seed layer 1S on a bottom surface of the substrate 11;

applying an electroplating process to the substrate 11, thereby forming a second electroplated metal layer 17 on the bottom surface of the substrate 11;

applying a thickness reducing process to the second electroplated metal layer 17; and patterning the second electroplated metal layer 17 to form a second upper metal circuit layer 17p through a photolithography process using a dry film, wherein there is a second patterned metallic seed layer 17Sp existing between the second upper metal circuit layer 17 and the bottom surface of the substrate 11.

Figure 10:
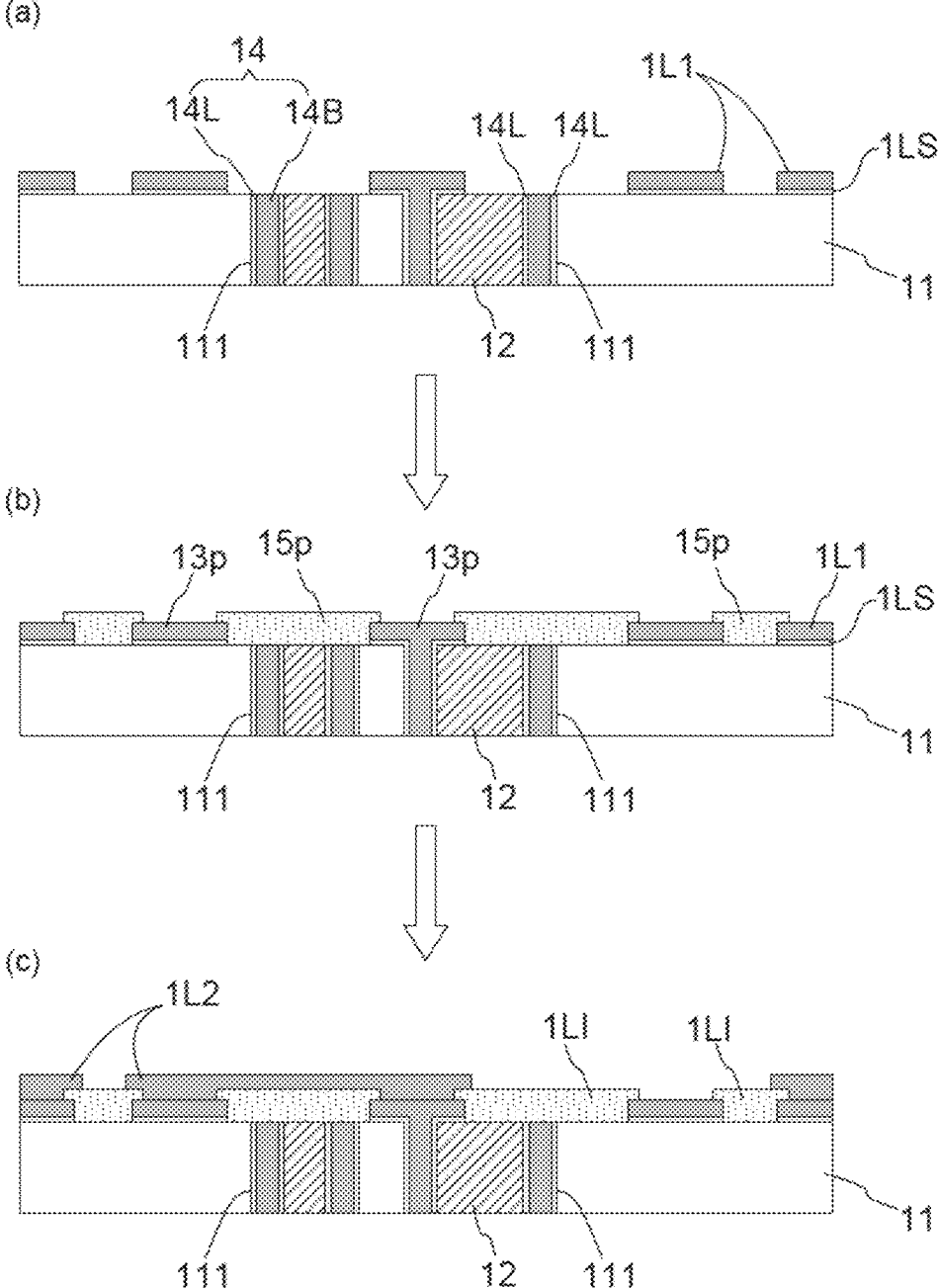
FIG. 10 shows diagrams for schematically describing a manufacturing process of the printed circuit board shown in FIG. 4.

In addition, FIG. 10 shows diagrams for schematically describing a manufacturing process of the printed circuit board shown in FIG. 4. In FIG. 10, diagram (a) depicts the printed circuit board as shown in FIG. 3, and diagrams (b)-(c) of FIG. 10 illustrate that a second metal circuit layer 1L2 is formed on the first metal circuit layer 1L1 by the following processing steps:

forming a patterned dielectric layer 1L1 on the first metal circuit layer 1L1; and forming a second metal circuit layer 1L2 on the patterned dielectric layer 1L1.

Figure 11:
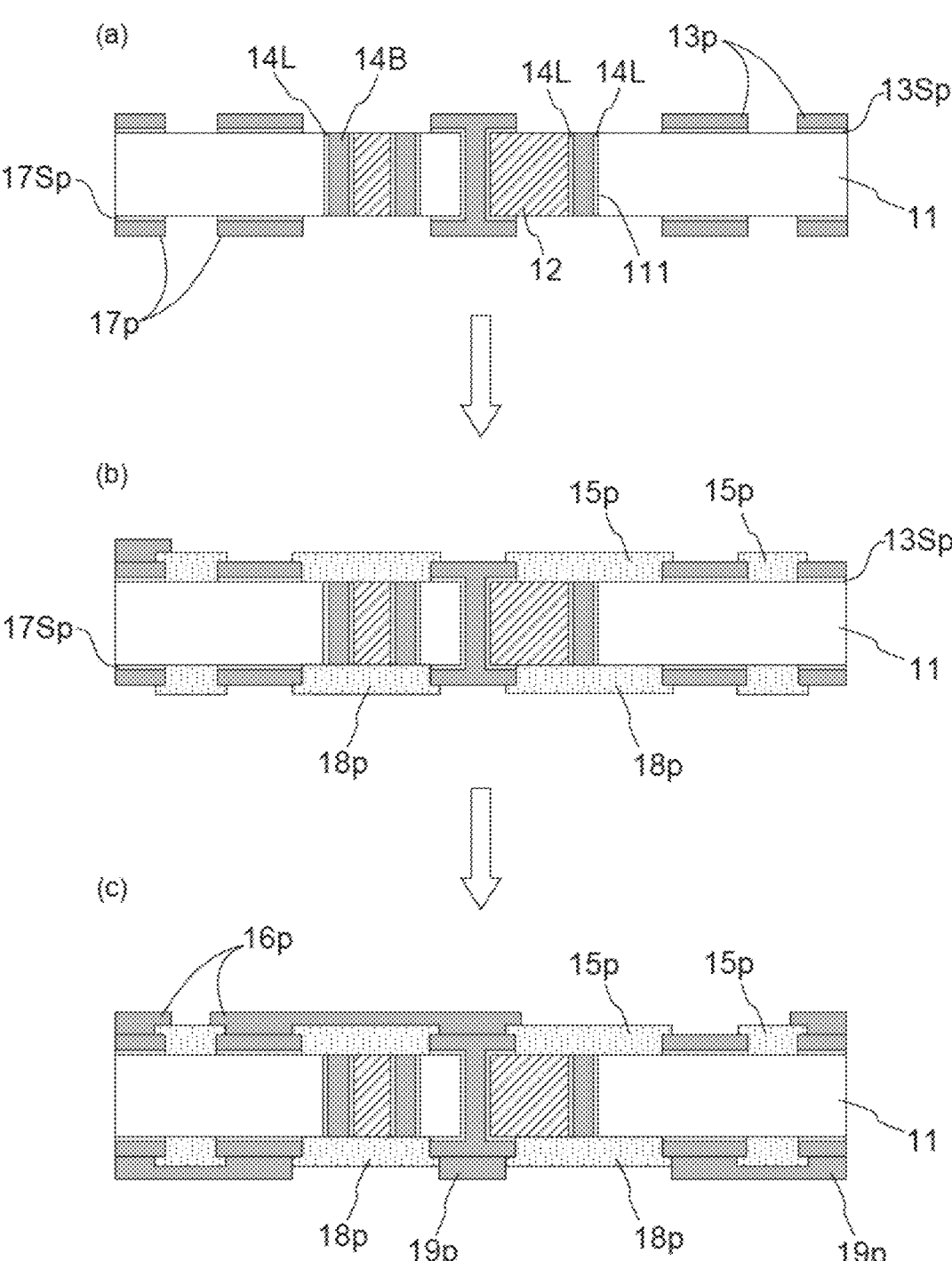
FIG. 11 shows diagrams for schematically describing a manufacturing process of the printed circuit board shown in FIG. 6.

Moreover, FIG. 11 shows diagrams for schematically describing a manufacturing process of the printed circuit board shown in FIG. 6. In FIG. 11, diagram (a) depicts the printed circuit board as shown in FIG. 5, and diagrams (b)-(c) of FIG. 11 describe that a second upper metal circuit layer 16p and a second lower metal circuit layer 19p are formed on the first upper metal circuit layer 13p and the first lower metal circuit layer 17p respectively by the following processing steps:

forming a first patterned dielectric layer 15p on the first upper metal circuit layer 13p;

forming a second upper metal circuit layer 16p on the first patterned dielectric layer 15p;

forming a second patterned dielectric layer 18p on the first lower metal circuit layer 17p; and forming a second lower metal circuit layer 19p on the second patterned dielectric layer 18p.

Therefore, through above descriptions, all embodiments and their constituting elements of the printed circuit board and the method for making the same by the present invention have been explicated completely and clearly; in summary, the present invention includes the advantages of:

(1) the present invention discloses a printed circuit board, comprising: a substrate having a plurality of through holes, a plurality of thermally-conductive blocks disposed in the through holes respectively, and a metal circuit formed on the substrate. According to the present invention, each of said through hole is provided with a bonding structure therein, such that the thermally-conductive block is tightly attached to the inner walls of the through holes through the bonding structure. Moreover, the bonding structure comprises a metal block and a metal layer coated on two side surfaces of the metal block, respectively. In brief, the bonding structure is used to replace the conventional adhesive layer made of epoxy resin to tightly fix the thermally-conductive block in the through hole. As such, the printed circuit board of the present invention has many advantages, including: enhanced thermal conduction ability, enhanced bonding strength of the thermally-conductive block with the inner wall of the through hole, elimination of the process of an adhesive agent solidifying step and a desmearing step, and avoiding the problem that the epoxy-based bonding structure would be aged and brittle by using a metal block and metal layers coated on the metal block.

The above description is made on embodiments of the present invention. However, the embodiments are not intended to limit the scope of the present invention, and all equivalent implementations or alterations within the spirit of the present invention still fall within the scope of the present invention.

What is claimed is:

1. A printed circuit board, comprising:

a substrate having a plurality of through holes;

a plurality of thermally-conductive blocks, disposed in the plurality of through holes respectively; and a first metal circuit layer, formed on a surface of the substrate;

wherein each of said thermally-conductive block is attached to at least one inner wall of said through hole through a bonding structure comprising a metal block and a metal layer coated on two side surfaces of the metal block, respectively.

2. The printed circuit board of claim 1, wherein the metal block comprises an electroplated copper block, and the metal layer is selected from a group consisting of a sputtered copper layer and a sputtered Ti/Cu layer.

3. The printed circuit board of claim 1, wherein the thermally-conductive block is selected from a group consisting of an aluminum nitride (AlN) block, an aluminum oxide ($Al_2O_3$) block, a silicon carbide (SiC) block, and a tungsten carbide (WC) block.

4. The printed circuit board of claim 1, further comprising:

a patterned dielectric layer, formed on the first metal circuit layer; and a second metal circuit layer, formed on the patterned dielectric layer and electrically connected to the first metal circuit layer.

5. The printed circuit board of claim 4, wherein the first metal circuit layer and the second metal circuit layer both comprise a copper circuit layer.

6. A printed circuit board, comprising:

a substrate having a plurality of through holes;

a plurality of thermally-conductive blocks, disposed in the plurality of through holes respectively;

a first upper metal circuit layer, formed on a top surface of the substrate; and a first lower metal circuit layer, formed on a bottom surface of the substrate;

wherein each of said thermally-conductive block is attached to at least one inner wall of said through hole through a bonding structure comprising a metal block and a metal layer coated on two side surfaces of the metal block, respectively.

7. The printed circuit board of claim 6, wherein the metal block comprises an electroplated copper block, and the metal layer is selected from a group consisting of a sputtered copper layer and a sputtered Ti/Cu layer.

8. The printed circuit board of claim 6, wherein the thermally-conductive block is selected from a group consisting of an aluminum nitride (AlN) block, an aluminum oxide ($Al_2O_3$) block, a silicon carbide (SiC) block, and a tungsten carbide (WC) block.

9. The printed circuit board of claim 6, further comprising:

a first patterned dielectric layer, formed on the first upper metal circuit layer; and a second upper metal circuit layer, formed on the first patterned dielectric layer and electrically connected to the first upper metal circuit layer.

10. The printed circuit board of claim 9, further comprising:

a second patterned dielectric layer, formed on the first lower metal circuit layer; and a second lower metal circuit layer, formed on the second patterned dielectric layer and electrically connected to the first lower metal circuit layer.

11. The printed circuit board of claim 10, wherein all of the first upper metal circuit layer, the second upper metal circuit layer, the first lower metal circuit layer, and the second lower metal circuit layer comprise a copper circuit layer.

12. A method for making a printed circuit board, comprising following steps:

forming a plurality of through holes in a substrate;

respectively disposing a thermally-conductive block in each said through hole;

applying a sputtering process to the substrate, so as to coat a top surface and two side surfaces of said thermally-conductive block, a top surface of the substrate, and at least one inner wall of said through hole with a sputtered metal layer, respectively;

applying an electroplating process to the substrate, such that each said through hole is filled with an electroplated metal member, and the top surface of the substrate is further coated with a first electroplated metal layer;

applying a thickness reducing process to the first electroplated metal layer; and patterning the first electroplated metal layer to form a first upper metal circuit layer through a photolithography process, such that a bonding structure is formed in each said through hole; wherein the bonding structure comprises the electroplated metal member and the sputtered metal layer coated on the inner wall of the through hole, and said thermally-conductive block is tightly attached to the inner wall of the through hole through said bonding structure.

13. The method of claim 12, wherein the thermally-conductive block is selected from a group consisting of an aluminum nitride (AlN) block, an aluminum oxide (Al$_2$O$_3$) block, a silicon carbide (SiC) block, and a tungsten carbide (WC) block.

14. The method of claim 12, wherein the electroplated metal member is an electroplated copper block, and the sputtered metal layer is selected from a group consisting of a sputtered copper layer and a sputtered Ti/Cu layer.

15. The method of claim 12, further comprising the following steps:

forming a first patterned dielectric layer on the first upper metal circuit layer; and forming a second upper metal circuit layer on the first patterned dielectric layer.

16. The printed circuit board of claim 15, further comprising the following steps:

forming a metallic seed layer on a bottom surface of the substrate;

applying an electroplating process to the substrate to form a second electroplated metal layer on the bottom surface of the substrate;

applying a thickness reducing process to the second electroplated metal layer; and patterning the second electroplated metal layer to form a second upper metal circuit layer through a photolithography process.

17. The method of claim 16, further comprising the following steps:

forming a second patterned dielectric layer on the first lower metal circuit layer; and forming a second lower metal circuit layer on the second patterned dielectric layer.

18. The method of claim 17, wherein all of the first upper metal circuit layer, the second upper metal circuit layer, the first lower metal circuit layer, and the second lower metal circuit layer comprise a copper circuit layer.

* * * * *